United States Patent
Dobashi et al.

(10) Patent No.: US 6,322,904 B1
(45) Date of Patent: *Nov. 27, 2001

(54) COPPER FOIL FOR PRINTED CIRCUIT BOARDS

(75) Inventors: Makoto Dobashi, Ageo; Hiroaki Kurihara, Kazo; Toshiko Yokota, Ageo; Hiroshi Hata, Okegawa; Naotomi Takahashi, Urawshi; Tatsuya Sudo, Ageoshi, all of (JP)

(73) Assignee: Mitsui Mining & Smelting Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/822,276

(22) Filed: Mar. 20, 1997

Related U.S. Application Data

(60) Provisional application No. 60/020,495, filed on Jun. 17, 1996.

(51) Int. Cl.$^7$ .......................... B21D 39/00; B32B 15/20; B05D 1/36; B05D 7/24
(52) U.S. Cl. .......................... 428/624; 428/632; 428/658; 428/674; 428/341; 428/901; 427/419.2; 427/419.5
(58) Field of Search ..................................... 428/624, 674, 428/341, 901, 658, 621, 623, 632; 427/419.2, 419.5

(56) References Cited

U.S. PATENT DOCUMENTS

| | | | |
|---|---|---|---|
| 4,093,768 | 6/1978 | Cordts et al. | 428/287 |
| 4,731,128 | 3/1988 | Casullo | 428/470 |
| 5,028,513 | 7/1991 | Murakami et al. | 430/315 |
| 5,567,534 | 10/1996 | Yano et al. | 428/607 |

FOREIGN PATENT DOCUMENTS

| | | |
|---|---|---|
| 195 12 196 A1 | 10/1995 | (DE) . |
| 0 700 238 A1 | 3/1996 | (EP) . |
| 80007717 B | 2/1980 | (JP) . |
| 1240683 A | 9/1989 | (JP) . |
| 3066496 A | 3/1991 | (JP) . |
| 4202780 A | 7/1992 | (JP) . |
| 5025407 A | 2/1993 | (JP) . |
| A 6-85417 | 3/1994 | (JP) . |
| A 6-85455 | 3/1994 | (JP) . |

OTHER PUBLICATIONS

Abstract for RD 302013 A, dated Jun. 10, 1989.

Primary Examiner—D. S. Nakarani
Assistant Examiner—Holly C. Rickman
(74) Attorney, Agent, or Firm—Jenkens & Gilchrist

(57) ABSTRACT

A copper foil having improved resistance to abrasion damage during the manufacture of printed circuit boards has a uniform deposit of benzotriazole (BTA) or BTA derivative, optionally a mixture thereof, of at least about 5 mg/m$^2$.

11 Claims, 2 Drawing Sheets

BTA (mg/m2)

BTA (mg/m2)

COPPER FOIL FOR PRINTED CIRCUIT BOARDS

CROSS-REFERENCE TO RELATED APPLICATIONS

This application claims the benefit of copending provisional application 60/020,495 filed Jun. 17, 1996.

BACKGROUND OF THE INVENTION

This invention relates to the thin copper foils which are used in manufacturing printed circuit boards (PCB). More particularly, the invention relates to copper foils having improved ability to resist the abrasion which leads to the formation of deep scratches and tears during handling.

It has been found, particularly in more demanding applications where relatively thin copper foils are used (e.g. one-half ounce/ft$^2$ or 18 μm thick), that when copper foil surfaces are exposed, that they can be damaged by abrasion, especially those which are relatively soft, such as copper foils which exhibit high percentage elongation at elevated temperatures. When scratches become severe, they can lead to tears in the foil and thus can cause rejection of the laminate or the partially completed PCB. In some cases, laminates may be rejected for their appearance even though severe damage has not occurred. Consequently, it is desirable to avoid abrasion damage insofar as possible.

Another common problem in the manufacture of PCBs is "resin spots". These are particles of resins, such as epoxy resins, adhering to the surface of the foil. Such particles interfere with the etching process used to make circuit lines and can lead to defects which cause rejection or reworking of a circuit board. Coating copper foils with thin layers of benzotriazole (BTA) has been found to reduce the number of "resin spots", but further improvement is needed in the industry, particularly when fine circuit lines are being made and very small resin particles are present.

It has been the practice in the industry to treat copper foils to protect them from corrosion during the period between their manufacture and their use in making printed circuit boards. One such treatment has been to apply benzotriazole and/or related compounds. For example, in U.S. patent application Ser. No. 08/496,502 now abandon both benzotriazole and aminotriazole or their derivatives were applied to rust-proof copper foil. Under the rust-proofing layer in the typical case would be a layer of electrodeposited zinc or a zinc alloy, followed by a chromate layer. It also was found that powdered epoxy resin did not adhere to the foil. The use of benzotriazole or aminotriazole alone was not as satisfactory U.S. patent application Ser. No. 08/686,574 now abandoned discloses the use of aminotriazole and/or its isomers to resist adherence of epoxy resin particles and to resist discoloration when soldering.

In Japanese patent application 1994-85417 the use of benzotriazole or its derivatives was shown to improve solderability and adhesion of resists on the shiny side of the foil.

In Japanese patent application 1994-85455 the use of benzotriazole or its derivatives was shown to improve resistance to moisture and thus the storage life of a treated copper foil. As with the 85417 application, the treatment was placed on the shiny side of the foil. The foil was first plated with zinc or a zinc alloy, then a chromate treatment was added, followed by coating with the benzotriazole.

The present inventors have been concerned with preventing damage to copper foils during handling and have found a method which substantially improves their abrasion resistance. The copper foils made according to the invention have the added advantage of further reducing the number of resin particles adhering to the exposed copper foil.

SUMMARY OF THE INVENTION

In one aspect, the invention is an improved copper foil for use in making printed circuit boards which has increased resistance to abrasion damage and thus minimizes scratching and tearing. A first layer of zinc or zinc alloy is applied to the foil followed by a second layer of benzotriazole (BTA) or a derivative thereof, hereinafter generally referred to as "BTA" (with the exception of the examples below) sufficient to provide the desired increased abrasion resistance. Preferably, the second layer of BTA is a uniform deposit of at least 5 mg/m$^2$ of foil, most preferably a uniform deposit of about 5 to 8 mg/m$^2$ is applied.

In another embodiment, a layer of chromate is deposited between the first zinc or zinc alloy layer and the second BTA layer. The intermediate chromate layer should be sufficiently thin to avoid interfering with the bonding of BTA to zinc and preferably it will be a uniform deposit of no more than about 1.5 mg/m$^2$.

In another aspect, the invention is a method of applying a BTA layer of the desired thickness by contacting the foil surface with an aqueous solution of BTA at a temperature of at least 20° C., preferably 40–70° C., for a period of time sufficient to attain the desired thickness. Optionally, after the contacting with BTA solution, the treated foil surface is washed with water to remove excess BTA not bound to the zinc or zinc alloy layer.

In still another embodiment, the invention comprises a laminate for use in making printed circuit boards consisting of an insulating substrate layer and at least one layer of the copper foil of the invention in which the surface of the foil containing the first and second layers described above is exposed.

The invention also includes in another aspect a printed circuit board comprising a laminate made with the copper foil of the invention.

DESCRIPTION OF ILLUSTRATIVE EMBODIMENTS

Laminates

Figure 1:
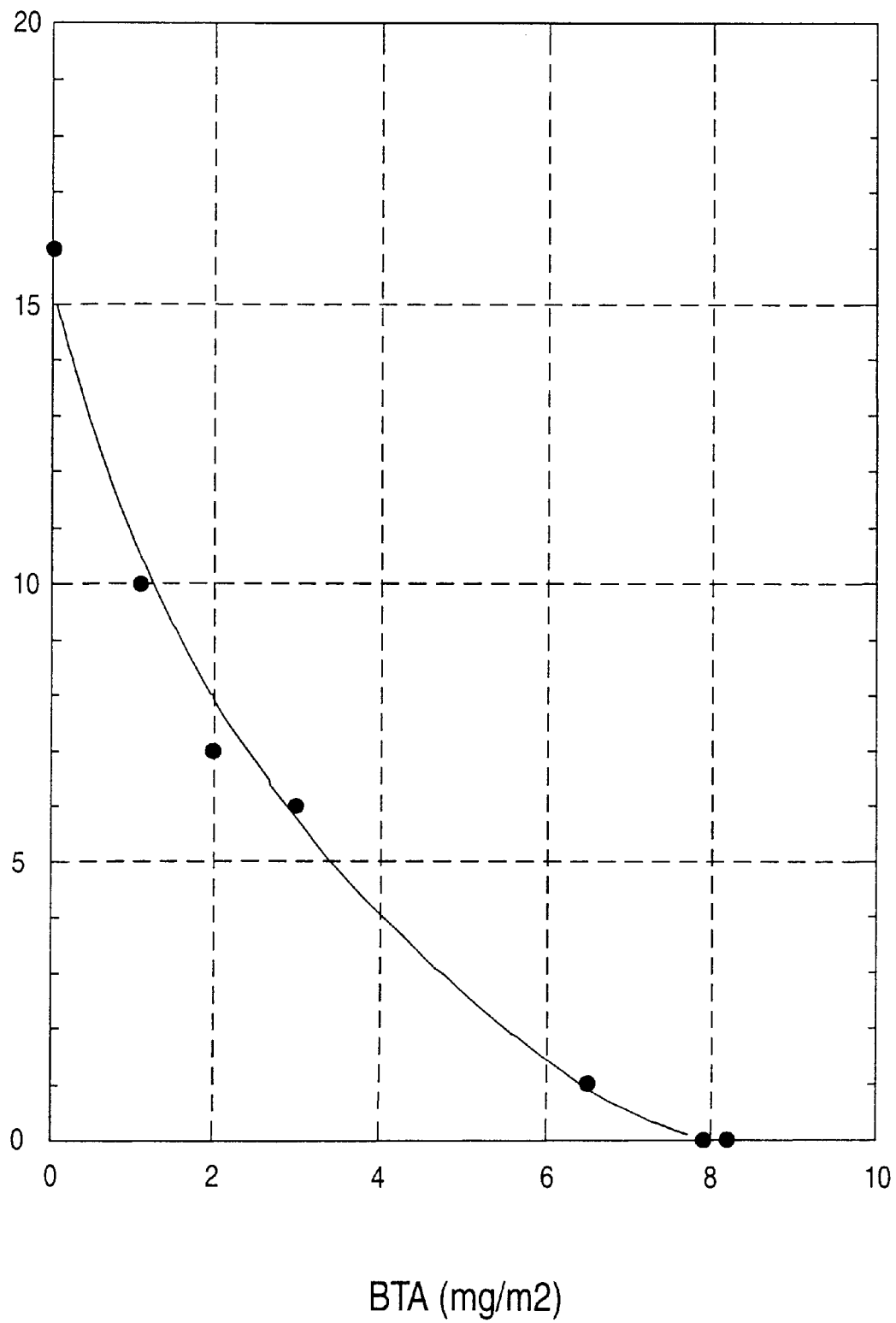
FIG. 1 is a plot of the number of scratches versus the amount of BTA.

Printed circuit boards are made using laminates in which thin copper foils are applied to insulating substrates such as glass fiber reinforced epoxy resins. Such laminates may be converted into circuit boards by photoimaging the desired circuit pattern and etching away unwanted copper foil. In simple circuit boards only a single side or both sides of the laminate are converted into circuits. In more complex circuit boards (i.e. multilayer boards) additional layers are added to the original circuit-containing laminate. As the laminates and circuit boards are handled during manufacture, they often come into contact with another laminate or circuit board, thereby creating an opportunity for abrasion to occur and leading to deep scratches and tears. These can lead to rejection of the laminate or the circuit board. While such damage can be associated with foreign matter, it can also occur when laminates or circuit boards are placed atop one another, for example when they are stacked and drilled together.

Another problem is associated particularly with thinner foils of about one-half ounce per square foot (about 18 μm thick). When assembling a circuit board with a sheet of "prepreg" (a partially cured sheet of fiber-reinforced resin) the glass fibers can press against the copper foil and cause distortion corresponding to the pattern of the glass fibers. Then, when sheets which have such copper foils exposed are placed next to each other, the weight and movement of the foils may create scratches, which can actually cause tears in the foil. Such damage to the copper foils is particularly of concern in the manufacture of circuit boards which have very fine circuit lines, that is, where the shape and separation of the circuit lines must be precise if the desired electrical performance of is the circuit is to achieved.

Copper Foils

Copper foils used in making laminates and PCBs are typically made by electrodeposition from copper salt solutions onto a rotating drum. The foils may be of various thicknesses, but frequently they have a thickness of 18 to 36 μm, which is equivalent to one-half to one ounce per square foot of foil. Thicker and thinner foils have been used and this invention is not limited to particular thicknesses, although thinner foils are more likely to be seriously damaged. Such foils are becoming more common as the industry moves in the direction of requiring narrower circuit lines and spaces.

As produced, copper foils are subject to oxidation and other corrosion. Thus, they are usually given coatings which provide protection against corrosion and assist in improving adhesion of the copper foil to a substrate. Zinc and zinc alloys have been used for this purpose, as well as others familiar to those skilled in the circuit board art. A chromate layer may also be applied after the first layer of zinc or other metals. The zinc containing layer is generally electrodeposited onto one or both sides of the foil, while the chromate layer may be electrodeposited or coated onto the first layer.

Typical of conditions used for zinc plating copper foil are:
1–10 g/l (as zinc) of Zinc pyrophosphate
50–150 g/l potassium pyrophosphate
pH 9–12
Room Temperature
Current Density: 0.1–1 A/dm$^2$
  Typical of conditions used for chromate treatment of zinc-plated copper to foil are:
  0.05–10 g/l chromic acid
  pH 9–13
  Current Density 0.1–5 A/dm$^2$ The side of the foil which was adjacent the drum has a low profile, that is, it is very smooth and is usually referred to as the "shiny" side of the foil. The opposite face of the foil is generally rougher and it has a matte appearance. In conventional practice, the rough or matte side of the foil is laminated to the substrate since it inherently makes a stronger bond with the substrate. Thus, the shiny side of the foil is exposed and it is this side which can be damaged by abrasion during handling. More recently, it has been suggested that improved definition of the circuit lines can be achieved if the shiny side of the foil is laminated to the substrate, thus leaving the matte side exposed. However, the shiny side must be given an electrodeposit of copper to roughen it and thereby to obtain adequate adhesion to the substrate. The present invention is particularly applicable to the shiny side of the foil because it is especially susceptible to scratching, but the invention also may be applied to the matte side or to the shiny side to which a roughening deposit has been applied.

It has been known to deposit a thin film of benzotriazole (BTA) to the surface of a copper foil and it has been observed that such a thin layer assists in preventing adhesion of resin particles (resin spots) which can interfere with the etching to produce circuit lines. This is particularly a problem with PCBs where fine lines and spaces are essential. The amount of BTA applied for that purpose is typically about 1 mg/m$^2$. However, the inventors have now discovered that much heavier layers can be applied and that they provide significant protection against abrasion which has been discussed above. Thus, a foil with such protective layer and the method of obtaining it are both aspects of the invention.

BTA (benzotriazole) is the preferred compound applied in the present invention. However, derivatives may be substituted for BTA or used as additives, although the performance may not be identical to that shown below when BTA is used. Such benzotriazole derivatives include carboxybenzotriazole, tolyltriazole, and their sodium salts or amino compounds thereof, such as monoethenolamine salts, cyclohexylamine salts, diisopropylamine salts, and morpholine salts. When reference is made to "BTA" (except in the examples below) it should be understood to refer to BTA itself or its derivatives, or mixtures thereof.

As will be seen in the examples below, the best results are obtained when the is BTA is applied in an amount of about 5 mg/m$^2$ or higher, preferably about 5 to 8 mg/m$^2$ of foil. It has been found that there appears to be a limit to the amount of BTA which can be applied and which is bound to the zinc alloy layer. Excess BTA does not adhere well and creates a cosmetic problem. Consequently, such excess BTA is usually washed off before the foil is used, although that step is not considered essential. It has been found that temperatures of at least 20° C. are needed to place the desired amount of BTA on the foil, at least within a practical period of time. The preferred temperature is about 40° C. or above, particularly 40–70° C. At these temperatures, contact with an aqueous solution of BTA for about 2–10 seconds is sufficient to apply the desired heavy deposit. Refer to Example 8 below and FIG. 3. The concentration of BTA is not considered important, generally 0.5–19 g./L are considered suitable. A solution containing about 3 g/L has been used successfully, as shown in the examples below.

Applying chromate on top of the zinc or zinc alloy layer is not necessary, but it may be done, provided that it does not interfere with the application of the BTA layer. Since the BTA is believed to chemically bond to the zinc, the application of an intermediate layer such as chromate has been found to hinder the ability to apply a heavy deposit of BTA. It is believed that no more than about 1.5 mg/m$^2$ of chromate should be applied to the zinc or zinc alloy layer.

EXAMPLES

In the following examples, a first layer of zinc (20 mg/m$^2$) was applied to the shiny surface of an 18 μm thick copper foil. The bath contained 6.0 g/L (as zinc) of zinc pyrophosphate and 100 g/L of potassium pyrophosphate. The pH was 10.5, the temperature was room temperature, the current density was 1 A/dm$^2$, and the reaction time 2 seconds. A chromate deposit was applied by passing the foil through a bath which contained 1.0 g/L of chromic acid for 2 seconds. The pH of the bath was 12.0. For some examples the chromate was applied by electrodepositing using a current density of 0.1 A/dm$^2$, in the others, no current was applied.

The foil, after receiving the layers of zinc and chromate, was given a coating of BTA by pouring over the foil an aqueous solution of 3 g/L BTA at various temperatures for about 3 seconds, after which excess BTA was washed off with water. The amount of BTA which had been deposited was measured by cutting off a 5×5 cm piece of the foil and immersing it for 10 minutes in 25 mL of a 0.2N solution of sulfuric acid. The concentration of BTA in sulfuric acid was measured by high pressure liquid chromatography (HPLC). A 20 $\mu$L sample was introduced into a 4.6 mm i.d. by 250 mm long column containing TSK GEL ODS 80TM packing operated at 40° C. 1.0 mL/min of a 50/50 volume mixture of acetonitrile/water was used to elute the BTA.

A scratch test was applied to compare the results obtained with various weights of BTA. Two samples (10 cm×10 cm) of the copper foil, each laminated to prepreg, were placed with their treated surfaces against each other and a weight of 6.9 kg was applied through a rubber pad. The samples were rubbed together under this load for a distance of 3 cm and the scratches deep enough to reach the bond between the copper foil and the substrate were measured. These cause tearing of the foil and lead to rejection if it should occur in commercial production of printed circuit boards.

In instances below where resin spot testing is reported the results were obtained by spreading powdered epoxy resin on the exposed copper foil face of a laminate. Then, a group of such laminates were assembled with stainless steel plates as separators. The package of laminates and stainless steel plates was heated and pressed to simulate lamination, after which the number of resin particles adhering to the stainless steel plates and the copper surfaces were evaluated.

Example 1

Zinc plating of 20 mg/m$^2$ and a chromate treatment by electrodeposition were applied as described above to one surface of a 18 $\mu$m thick electroplated copper foil.

The surface was contacted with a 60° C. BTA solution (3 g/L) for 3 seconds followed by water washing to achieve a BTA deposit of 8.2 mg/m$^2$.

Example 2

Zinc plating of 20 mg/m$^2$ and a chromate treatment by dipping (i.e. without applying current) were applied to the shiny surface of an 18 $\mu$m thick electroplated copper foil.

The surface was contacted with a 60° C. BTA solution (3 g/L) for 3 seconds followed by water washing to achieve a BTA deposit of 7.9 mg/m$^2$.

The bath compositions and conditions of the zinc plating and chromate treatment were the same as those in Example 1, with the exception that the current density in the chromate treatment which was changed to 0 A/dm$^2$.

Example 3

Zinc plating of 20 mg/m$^2$ and chromate treatment by dipping were applied to the shiny surface of an 18 $\mu$m thick electroplated copper foil.

The surface was contacted with a 50° C. BTA solution (3 g/L) for 5 seconds followed by water washing to achieve the amount of BTA deposit of 6.5 mg/m$^2$.

The bath compositions and conditions of the zinc plating and chromate treatment were the same as those in Example 2.

Example 4

(Comparative)

Zinc plating of 20 mg/m$^2$ and chromate treatment by dipping were applied to the shiny surface of an 18 $\mu$m thick electroplated copper foil.

The surface was then contacted with a 50° C. BTA solution (3 g/L) for 1 second followed by water washing to achieve the a BTA deposit of 3.0 mg/m$^2$.

The bath compositions and conditions of the zinc plating and chromate treatment were the same as those in Example 2.

Example 5

(Comparative)

Zinc plating of 20 mg/m$^2$ and chromate treatment by electrodeposition were applied to the shiny surface of an 18 $\mu$m-thick electroplated copper foil.

The surface was then contacted with a 50° C. BTA solution (3 g/L) for 1 second followed by water washing to achieve the a BTA deposit of 2.0 mg/m$^2$.

The bath compositions and conditions of the zinc plating and chromate treatment were the same as those in Example 1.

Example 6

(Comparative)

Zinc plating of 20 mg/m$^2$ and a chromate treatment by electrodeposition were applied to the shiny surface of an 18 $\mu$m thick electroplated copper foil.

The surface was then contacted with a 30° C. BTA solution (3 g/L) for 1 second followed by water washing to achieve a BTA deposit of 1.1 mg/m$^2$.

The bath compositions and conditions of the zinc plating and chromate treatment were the same as those in Example 1.

Example 7

(Comparative)

Zinc plating of 20 mg/m$^2$ and a chromate treatment by electrodeposition were applied to the shiny surface of an 18 $\mu$m thick electroplated copper foil. No BTA was applied.

The bath compositions and conditions of the zinc plating and chromate treatment were the same as those in Example 1.

Each sample of foil was subject to the scratch test described above. The results are shown in Table A.

TABLE A

| Examples | Deposition of Benzotriazole (mg/m$^2$) | Number of Tears |
| --- | --- | --- |
| Example 1 | 8.2 | 0 |
| Example 2 | 7.9 | 0 |
| Example 3 | 6.5 | 1 |
| Example 4 | 3.0 | 6 |
| Example 5 | 2.0 | 7 |
| Example 6 | 1.1 | 10 |
| Example 7 | 0.0 | 16 |

It is apparent, from the results shown in Table A, that the number of deep scratches which caused tears on the surface of a copper foil decreases as the amount of BTA adhered to the surface increases. It can be seen that a deposit of BTA of over about 5 mg/m2 drastically improves the anti-scratch capability of the foil surface.

Figure 2:
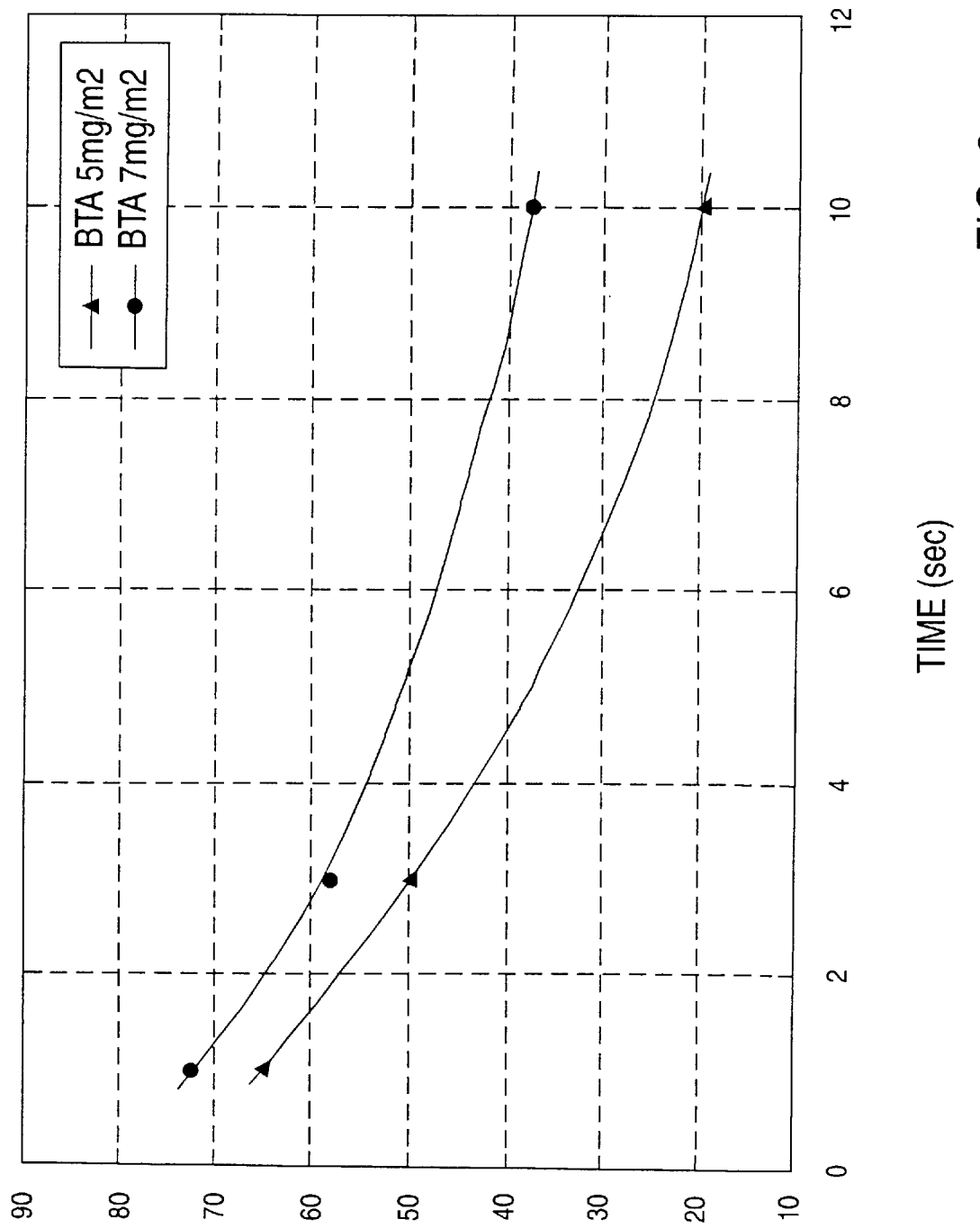
FIG. 2 is a plot of the relationship between time and temperature for deposition of BTA.

FIG. 2 shows a plot of the above data correlating the weight of the BTA deposit with the number of tears produced by deep scratching.

Treating copper foil according to the invention serves to reduce the occurrence of deep scratches on the foil's surface.

This helps to avoid defects, such as open circuits which can result from abrasion of the foil.

Example 8

Copper foil treated with zinc and chromate were treated with a 2.5 g/L BTA solution at series of temperatures and contact time to establish the conditions under which heavy coatings of BTA could be deposited according to the invention. The results are plotted in FIG. 3. It can be seen that for a given solution temperature more BTA is deposited with increasing contact time. When the temperature is increased, it is possible to reduce the contact time. The temperature may range from about room temperature up to about 60–70° C. and up to 10 seconds contact time will produce the desired amount of BTA, that is, at least 5 mg/m².

Example 9

Samples of commercial copper foils were compared. Each had already been coated with zinc and chromate. They were dipped into a 3 g/L BTA solution for 1 second at 28° C. or at 60° C. After 2 more seconds had elapsed, the samples were rinsed in water and dried. Then, the amount of BTA adhering to the surface was measured, with the results shown in the Table below.

TABLE B

| Foil Source | Foil Thickness, um | Surface Analysis (mg/m²) | | BTA (mg/m²) | |
|---|---|---|---|---|---|
| | | Zn | Cr | 28° C. | 60° C. |
| Mitsui (3EC-3) | 35 | 19.8 | 1.0 | 3.3 | 6.5 |
| Mitsui (3EC-3) | 18 | 21.4 | 1.0 | — | 6.2 |
| Gould | 35 | 13.7 | 3.3 | 0.8 | 2.9 |
| Gould | 18 | 10.4 | 2.8 | 0.5 | 2.8 |
| Circuit Foil | 35 | 15.7 | 1.5 | 3.8 | 5.9 |
| Fukuda | 35 | 7.1 | 1.5 | 2.0 | 4.4 |

It was concluded that the chromate treatment should not be too heavy if one wishes to deposit a coating of BTA of about 5–8 mg/m² in order to provide scratch resistance to the copper foil. Preferably, the chromate deposit should be no more than about 1.5 mg/m². It is believed that the chromate treatment interferes with chemical is bonding of the BTA to the underlayer of zinc and makes it possible to wash off some of the BTA with the water washing step.

What is claimed is:

1. In copper foils for use in printed circuit boards the improvement comprising increasing resistance to abrasion by applying a first layer of zinc or zinc alloy on a surface of said foil and applying a second layer of benzotriazole (BTA) from an aqueous solution consisting essentially of BTA and water, said second layer being at least 5 mg/m² and sufficient to provide said increased resistance to abrasion damage, and applying a layer of chromate no more than about 1.5 mg/m² between said first and second layers.

2. A copper foil of claim 1 wherein said second layer of BTA is deposited by contacting foil containing said first layer with an aqueous solution consisting essentially of BTA and water at a temperature of at least 20° C. for a period of time sufficient to deposit the desired amount of said second layer.

3. A copper foil of claim 2 wherein said deposit temperature is about 40° C. to 70° C.

4. A copper foil of claim 2 wherein said second layer is washed with water after being deposited.

5. A copper foil of claim 1 wherein said first and second layers are applied to a shiny surface of said foil.

6. A laminate comprising a substrate layer and at least one layer of the copper foil of claim 1 wherein said surface containing said first and second layers is exposed.

7. A printed circuit board comprising at least one laminate of claim 6.

8. A method of applying an abrasion protective layer of BTA to the shiny face of a copper foil consisting essentially of:

(a) applying a layer of zinc or zinc alloy to the surface of said copper foil;

(b) applying a layer of no more than about 1.5 mg/m² of chromate to the zinc-coated copper foil of (a);

(c) contacting said copper foil resulting from (b) with an aqueous solution consisting essentially of BTA and water at a temperature and time sufficient to deposit at least 5 mg/m² of BTA on said chromate layer.

9. A method of claim 8 wherein said solution is applied to said foil at a temperature of at least 20° C.

10. A method of claim 9 wherein said solution is applied to said foil at a temperature of about 40° to 70° C.

11. The method of claim 8 wherein the layer deposited in step (c) is washed with water after being deposited.

* * * * *